United States Patent
Lehnert et al.

(10) Patent No.: US 9,881,991 B2
(45) Date of Patent: Jan. 30, 2018

(54) CAPACITOR AND METHOD OF FORMING A CAPACITOR

(71) Applicant: Infineon Technologies AG, Neubiberg (DE)

(72) Inventors: Wolfgang Lehnert, Lintach (DE); Michael Stadtmueller, Villach (AT); Stefan Pompl, Landshut (DE); Markus Meyer, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/918,190

(22) Filed: Oct. 20, 2015

(65) Prior Publication Data
US 2016/0043164 A1   Feb. 11, 2016

Related U.S. Application Data

(62) Division of application No. 14/170,085, filed on Jan. 31, 2014, now Pat. No. 9,196,675, which is a division
(Continued)

(51) Int. Cl.
*H01L 27/108* (2006.01)
*H01L 49/02* (2006.01)
(Continued)

(52) U.S. Cl.
CPC ........ *H01L 28/60* (2013.01); *H01L 27/10829* (2013.01); *H01L 27/10861* (2013.01); *H01L 29/66181* (2013.01); *H01L 29/945* (2013.01)

(58) Field of Classification Search
CPC ......... H01L 27/10829; H01L 27/10861; H01L 29/66181; H01L 29/945
See application file for complete search history.

(56) References Cited

U.S. PATENT DOCUMENTS

| 4,971,926 A | 11/1990 | Kinugawa |
| 5,344,796 A | 9/1994 | Shin et al. |

(Continued)

FOREIGN PATENT DOCUMENTS

| DE | 3530773 A1 | 3/1986 |
| DE | 3382688 T2 | 9/1993 |

OTHER PUBLICATIONS

Liu, G., et al., "Selective area crystallization of amorphous silicon films by low-temperature rapid thermal annealing," Aug. 14, 1989, pp. 660-662, Applied Physics Letters, 55 Issue 7, American Institute of Physics.

*Primary Examiner* — Phat X Cao
(74) *Attorney, Agent, or Firm* — Slater Matsil, LLP (57) ABSTRACT

A method for manufacturing a semiconductor device and a semiconductor device are disclosed. The method comprises forming a trench in a substrate, partially filling the trench with a first semiconductive material, forming an interface along a surface of the first semiconductive material, and filling the trench with a second semiconductive material. The semiconductor device includes a first electrode arranged along sidewalls of a trench and a dielectric arranged over the first electrode. The semiconductor device further includes a second electrode at least partially filling the trench, wherein the second electrode comprises an interface within the second electrode.

20 Claims, 7 Drawing Sheets

Related U.S. Application Data of application No. 13/007,392, filed on Jan. 14, 2011, now Pat. No. 8,685,828.

(51) Int. Cl.
*H01L 29/66* (2006.01)
*H01L 29/94* (2006.01)

(56) References Cited

U.S. PATENT DOCUMENTS

| | | |
|---|---|---|
| 5,514,880 A | 5/1996 | Nishimura et al. |
| 5,561,310 A | 10/1996 | Woo et al. |
| 5,736,438 A | 4/1998 | Nishimura et al. |
| 5,804,499 A | 9/1998 | Dehm et al. |
| 5,902,650 A | 5/1999 | Feng et al. |
| 5,913,125 A | 6/1999 | Brouillette et al. |
| 5,930,625 A | 7/1999 | Lin et al. |
| 5,960,294 A | 9/1999 | Zahurak et al. |
| 6,355,517 B1 | 3/2002 | Sunami et al. |
| 6,610,361 B1 | 8/2003 | Heuer et al. |
| 6,872,620 B2 | 3/2005 | Chidambarrao et al. |
| 7,144,750 B2 | 12/2006 | Ouellet et al. |
| 7,157,327 B2 | 1/2007 | Haupt |
| 7,160,752 B2 | 1/2007 | Ouellet et al. |
| 8,143,135 B2 | 3/2012 | Kemerer et al. |
| 8,318,575 B2 | 11/2012 | Lehnert et al. |
| 8,685,828 B2 * | 4/2014 | Lehnert ............ H01L 29/66181 257/E29.346 |
| 2001/0012656 A1 * | 8/2001 | Rhodes ................... H01L 28/84 438/239 |
| 2002/0001165 A1 | 1/2002 | Yamamichi |
| 2002/0019095 A1 | 2/2002 | Edgar |
| 2002/0135407 A1 | 9/2002 | Funk et al. |
| 2003/0045068 A1 | 3/2003 | Gutsche et al. |
| 2003/0132506 A1 | 7/2003 | Rhee et al. |
| 2003/0143801 A1 * | 7/2003 | Basceri ................... H01L 28/55 438/240 |
| 2004/0079979 A1 | 4/2004 | Lee et al. |
| 2005/0067647 A1 | 3/2005 | Bulsara et al. |
| 2006/0094184 A1 | 5/2006 | Katsumata |
| 2006/0216420 A1 | 9/2006 | Shimada |
| 2006/0289931 A1 | 12/2006 | Kim et al. |
| 2008/0067568 A1 | 3/2008 | Abbasi et al. |
| 2008/0076230 A1 | 3/2008 | Cheng et al. |
| 2008/0079048 A1 | 4/2008 | Kim et al. |
| 2008/0105935 A1 | 5/2008 | Ogura et al. |
| 2008/0246069 A1 | 10/2008 | Dyer et al. |
| 2009/0039404 A1 | 2/2009 | Cho et al. |
| 2009/0108403 A1 | 4/2009 | Gogoi |
| 2009/0130457 A1 | 5/2009 | Kim et al. |
| 2009/0191686 A1 | 7/2009 | Wang et al. |
| 2010/0252910 A1 | 10/2010 | Fujimori et al. |
| 2012/0007035 A1 | 1/2012 | Jo et al. |
| 2012/0061798 A1 | 3/2012 | Wong et al. |
| 2012/0181656 A1 | 7/2012 | Lehnert et al. |

* cited by examiner

CAPACITOR AND METHOD OF FORMING A CAPACITOR

This is a divisional application of U.S. application Ser. No. 14/170,085 filed on Jan. 31, 2014, which is a divisional application of U.S. application Ser. No. 13/007,392 filed on Jan. 14, 2011 and are both incorporated herein by reference.

CROSS-REFERENCE TO RELATED APPLICATIONS

This application relates to commonly assigned U.S. patent application Ser. No. 13/022,411, which was filed on Feb. 7, 2011, and issued as U.S. Pat. No. 8,318,575 on Nov. 27, 2012, entitled "Compressive Polycrystalline Silicon Film and Method of Manufacture Thereof" and to co-pending and commonly assigned U.S. patent application Ser. No. 13/660,966, which was filed on Oct. 25, 2012 and is entitled "Compressive Polycrystalline Silicon Film and Method of Manufacture Thereof."

TECHNICAL FIELD

The present invention relates generally to semiconductor devices and methods of making semiconductor devices.

BACKGROUND

Semiconductor devices are employed in various systems for a wide variety of applications. Device fabrication typically involves a series of process steps including layering material on a semiconductor substrate wafer, patterning and etching one or more of the material layers, doping selected layers and cleaning the wafer.

Semiconductor manufacturers continually seek new ways to improve performance, decrease cost and increase capacity of semiconductor devices. Capacity and cost improvements may be achieved by shrinking device size. For example, in the case of trench capacitors, more and more cells can fit onto the chip by reducing the size of the memory cell components such as capacitors and transistors. The size reduction results in greater memory capacity for the chip. Cost reduction is achieved through economies of scale. Unfortunately, performance can suffer when device component size is reduced. Therefore, it is a challenge to balance performance with other manufacturing constrains.

SUMMARY OF THE INVENTION

In accordance with an embodiment of the present invention, a method for manufacturing a semiconductor device is disclosed. The method comprises forming a trench in a substrate, partially filling the trench with a first semiconductive material, forming an interface along a surface of the first semiconductive material, and filling the trench with a second semiconductive material.

In accordance with another embodiment of the present invention, a semiconductor device is disclosed. The semiconductor device includes a first electrode arranged along sidewalls of a trench and a dielectric arranged over the first electrode. The semiconductor device further includes a second electrode at least partially filling the trench, wherein the second electrode comprises an interface within the second electrode.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2 through 7c show cross-sectional views of a trench capacitor at various stages of manufacturing in accordance with embodiments of the present invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a trench capacitor. The invention may also be applied, however, to a trench transistor or other semiconductor devices having a trench.

Figure 1A:
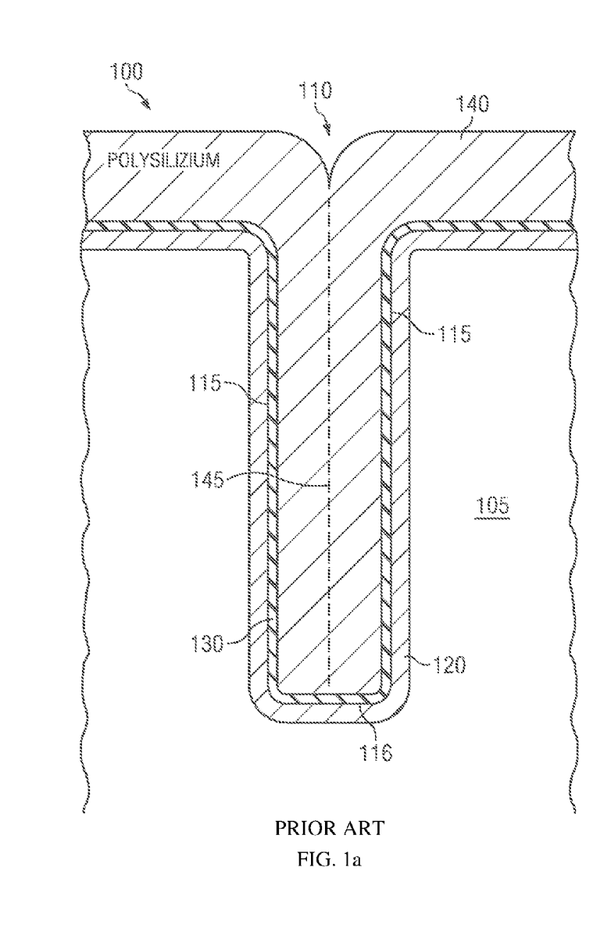
FIG. 1a shows a cross sectional view of a conventional trench capacitor.

FIG. 1a shows a conventional trench capacitor 100. The trench capacitor 100 may be formed by forming a trench 110 in a substrate 105. A first electrode or an outer electrode 120 may be formed along the sidewalls 115 and the bottom surface 116 of trench 110. A dielectric layer 130 may be formed over the first electrode 120. A second electrode or inner electrode 140 may be formed by filling the trench 110 over the dielectric layer 130. The second electrode 140 may be doped amorphous silicon or doped polysilicon. Filling the trench 110 with amorphous silicon or polysilicon may form a seem line or sequence of voids 145 in the middle of the trench 110. The seem line or sequence of voids 145 is formed where the amorphous silicon or polysilicon grows together when the trench 110 is filled.

Figure 1B:
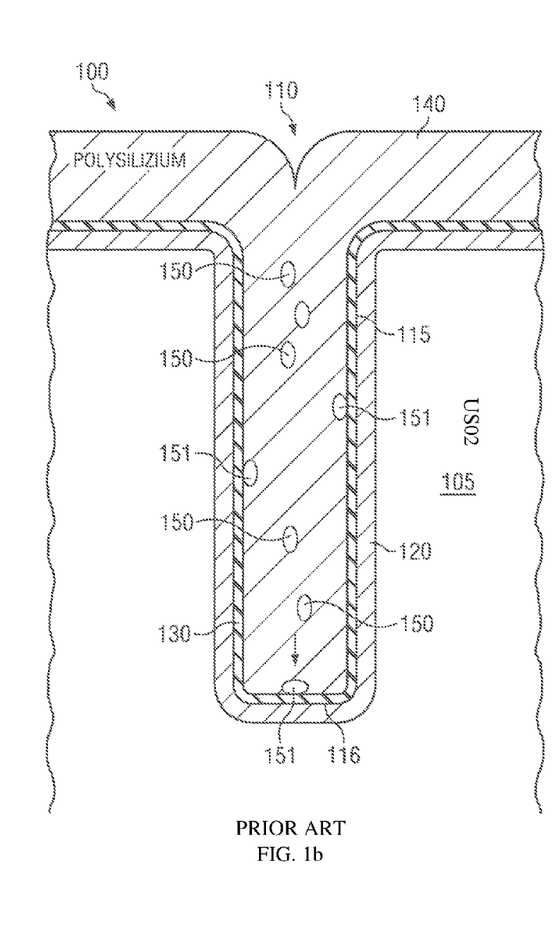
FIG. 1b shows a cross sectional view of a conventional trench capacitor showing voids.

The amorphous silicon or polysilicon may be annealed to a temperature of above 600 C, i.e. typically to a temperature of about 900 C or more. Annealing may change the crystallization structure of the amorphous silicon or polysilicon and voids 150 may be created as shown in FIG. 1b. The voids 150 may be predominantly created along the center line 145 where the layers grow together. As can be seen in FIG. 1b, the voids 150 may move towards the sidewalls 115 and the bottom surface 116 of the trench 110 while the polysilicon recrystallizes. The voids 150 may finally gather at the dielectric layer 130 along the sidewalls 115 and the bottom surface 116 of the trench 110 having a negative impact on the electrical properties and the reliability of the trench capacitor 100.

These and other problems are generally solved or circumvented, and technical advantages are generally achieved, by embodiments of the present invention. In one embodiment an interface may be formed within a semiconductive fill of the trench. The interface may prevent voids from moving to the sidewalls and/or to the bottom surface of the trench. The interface may function as a void trap. Preventing voids from moving to the sidewalls and/or the bottom surface of the trench improves electrical performance and reliability of the semiconductor device.

In one embodiment the interface is a grain boundary. The grain boundary may be generated by filling the trench with at least two semiconductive fill materials forming a second electrode. The semiconductive fill materials may be a same material deposited in two process steps. In one embodiment the interface is a thin isolation layer. The thin isolation layer may be a nitride or an oxide of less than about 3 nm thickness. In one embodiment the thin isolation layer may be an oxide layer forming islands after applying a high temperature process. The islands may have a form similar to a pearl necklace.

One advantage of an embodiment is that voids may be avoided on the dielectric layer along the sidewalls and the bottom surface of the trench regardless of the trench design. Another advantage of an embodiment is that the semiconductive fill material may not be doped with specific doping materials and/or a specific doping concentrations in order to suppress movements of the voids.

FIGS. 2 through 7b show cross-sectional views of a trench capacitor at various stages of manufacturing in accordance with embodiments of the present invention.

Figure 2:
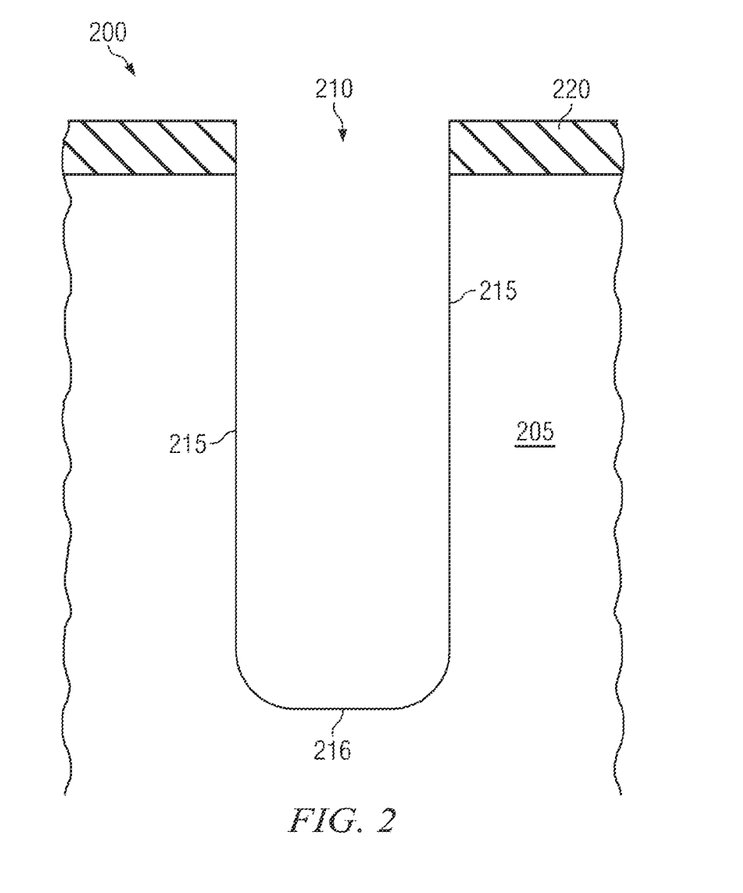

FIG. 2 shows a workpiece 200 comprising a pad stack 220 over a substrate 205. The substrate 205 may be silicon (Si), silicon-germanium (SiGe), gallium arsenide (GaAs), indium phosphide (InP), silicon carbide (SiC) or the like. The substrate may be bulk silicon or silicon on insulator (SOI), for example. The pad stack 220 may be a pad oxide, a pad nitride or a multi-layer material stack. The pad stack 220 may be structured applying known methods. The pad stack 220 may be opened and a trench 210 may be formed into the substrate 205. For example, the trench may be formed by applying a reactive ion etching (RIE) or a similar process. The trench comprises sidewalls 215 and a bottom surface 216. The trench 210 may be rinsed after the etch process is completed.

Figure 3:
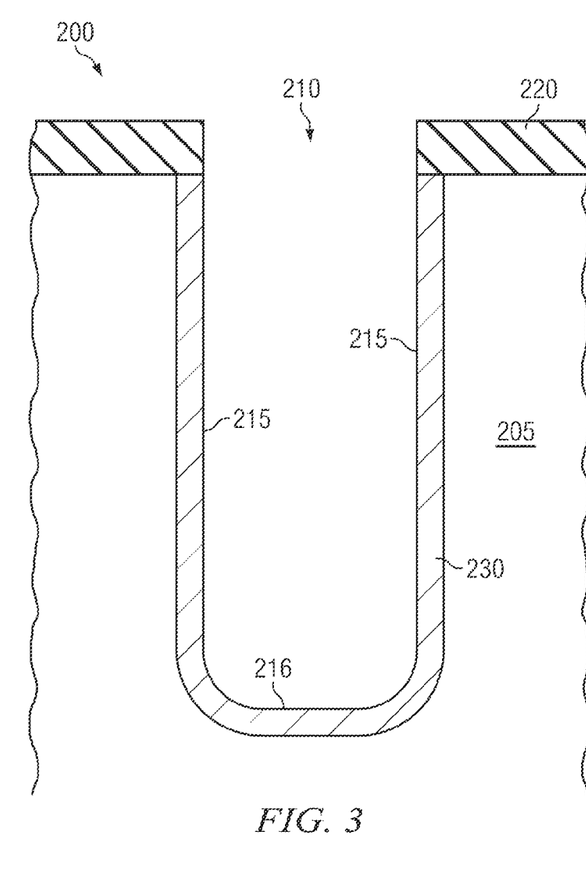

A first electrode 230 may be formed in the trench sidewalls 215 and the bottom surface 216 as illustrated in FIG. 3. The first electrode 230 may be formed by implanting dopants into the sidewalls 215 and the bottom surface 216 of the trench 210. The first electrode 230 may be formed by gas phase doping, diffusion, or by the use of doped bulk material. Alternatively, the first electrode 230 may be formed along and over the sidewalls 215 and the bottom surface 216 of the trench 210 by depositing a conductive material such as a doped polysilicon. The first electrode 230 may be n or p doped.

Figure 4:
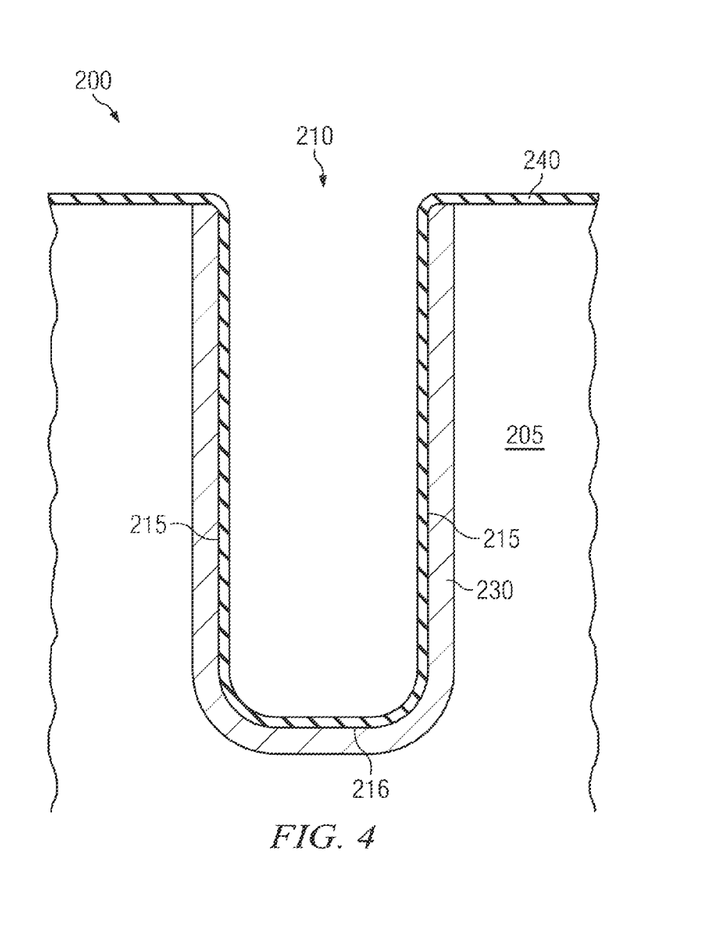

Referring now to FIG. 4, a dielectric layer 240 may be formed along and over the first electrode 230. The dielectric layer 240 may comprise a single layer or a plurality of layers. The dielectric layer 240 may be a node dielectric. The node dielectric may be an oxide, a nitride, a high-k dielectric material or combinations thereof. The node dielectric may be a multilayer dielectric such as an oxide nitride oxide (ONO), for example. Alternatively, the node dielectric may be ON, ONON, or any other kind of oxide/high-k/nitride stacks. The thickness of the dielectric layer 240 may be chosen according to maximum break down voltage requirements. For example, the dielectric layer 240 may be about 2 nm to about 50 nm thick. For high voltage applications, the dielectric layer 240 may be about 100 nm or more thick.

As illustrated in FIGS. 5-7b, a second electrode 250/270 may be formed in the trench. The second electrode 250/270 may fill the entire trench 210 or may fill only a part of the trench 210. If the second electrode 250/270 fills only a part of the trench 210 the rest of the trench 210 may be filled with a fill material different of that of the second electrode 250/270. The second gate electrode 250/270 may be a conductive material such as a metal, a semiconductive material or a doped semiconductive material.

Figure 5:
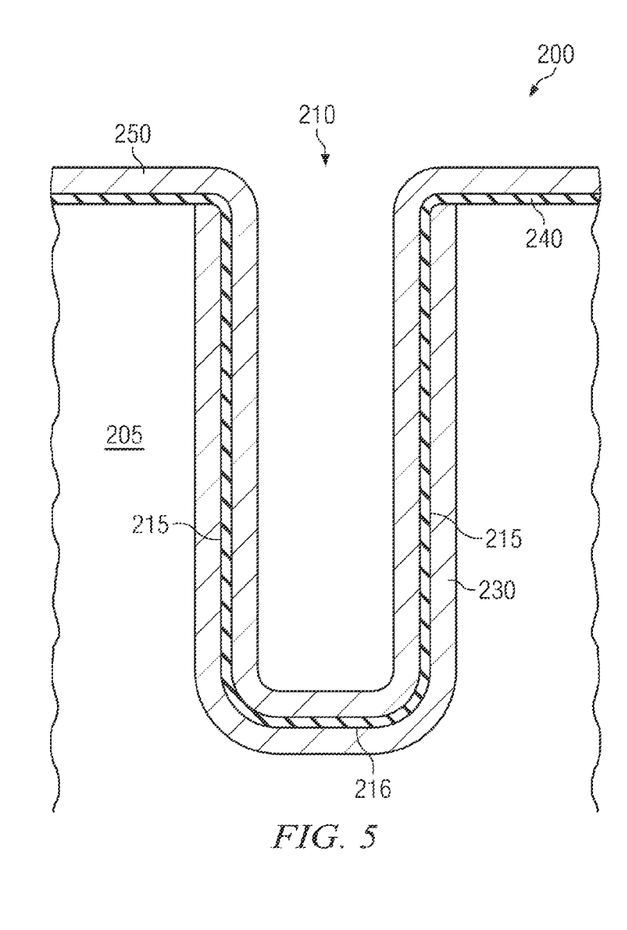

The trench may be filled with a first semiconductive material 250 up to a first thickness as illustrated in FIG. 5. The first thickness of the silicon material 250 may comprise a trench fill of about 10% to about 90%. On the one hand, the silicon material 250 may be at least thick enough that the voids cannot get too close to the sidewalls/bottom surface 215/216 of the trench. On the other hand, after forming the silicon material 250, the trench 210 may still comprise an opening for a further deposition of a silicon material. For example, with a trench opening of 1 µm, the thickness of the first semiconductive material 250 may be around 50 nm to 450 nm. The first semiconductive material 250 may be annealed to a temperature above the recrystallization temperature, e.g., to a temperature of about 800 C or higher. The first semiconductive material 250 may shrink and change its crystallization structure when annealed. No or only a few voids may be created since the first semiconductive material 250 does not fill the trench completely.

Figure 6A:
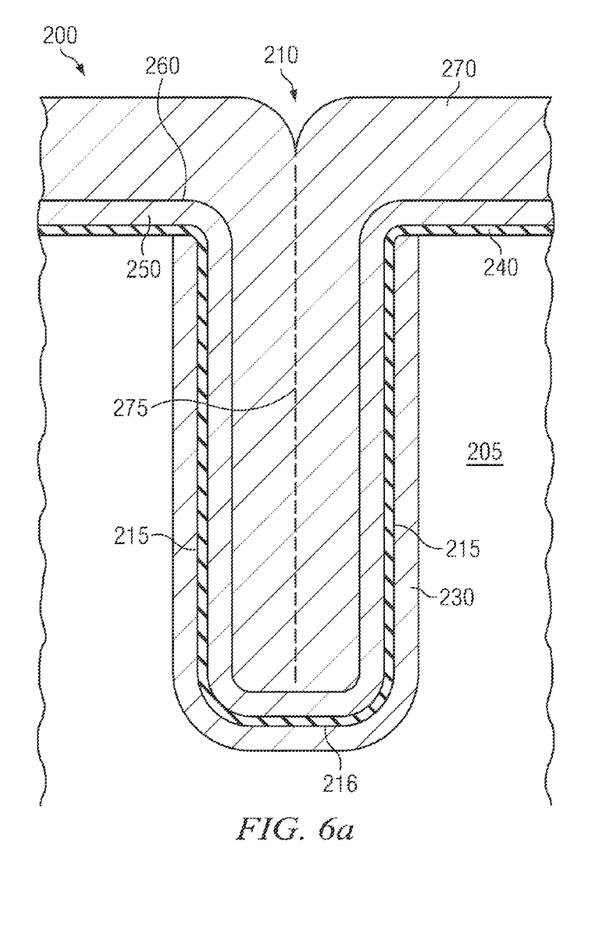
Figure 7A:
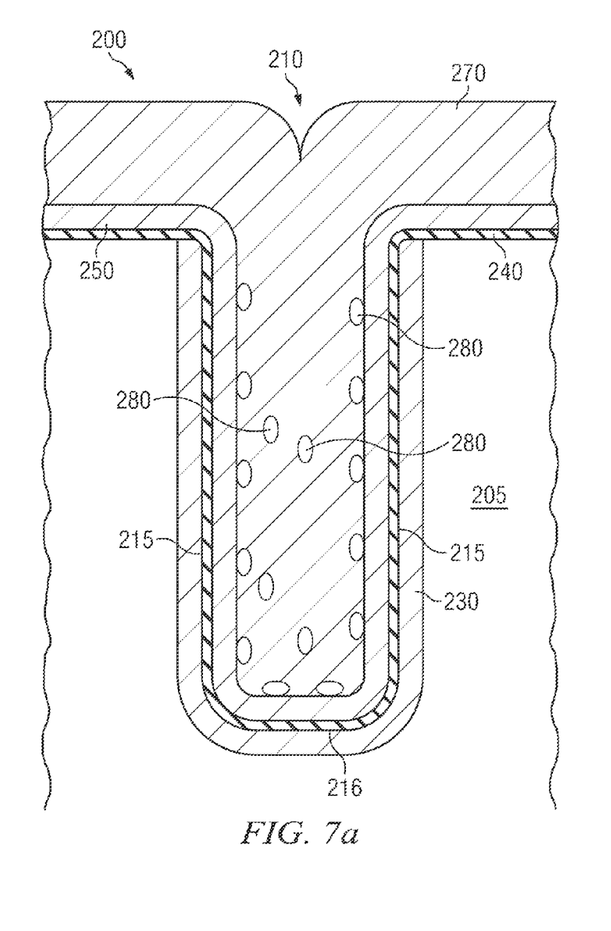

Referring now to FIGS. 6a and 7a, after annealing the first semiconductive material 250, the trench 210 may be filled with a second semiconductive material 270 in one embodiment. The second semiconductive material 270 may fill the trench completely, creating a seem line or a sequence of voids along the center line. The second semiconductive material 270 may be annealed to a temperature above the crystallization temperature, e.g., to a temperature of about 800 C or higher. The second semiconductive material 270 may change its crystallization structure when annealed. Additional voids may be created through volume changes in the crystal structure predominantly along the seem line 275. The voids 280 may move towards the sidewalls 215 and the bottom surface 216 of the trench 210 but are trapped at the interface 260 formed by grain boundaries. The grain boundaries are formed on the surface of the first semiconductive material 250 due to the previous annealing. The voids 280 may gather or assemble at the interface 260 and not at the dielectric layer 240 over the sidewalls 215 and the bottom surface 216 of the trench 210. Voids 280 may not be found or may be found in a significantly reduced manner in the first semiconductive material 250.

The first semiconductive material 250 and the second semiconductive material 270 may be a same material or different materials. The first and second semiconductive materials 250/270 may be silicon, germanium, gallium nitride (GaN), SiC, GaAs, or the like. The first and second semiconductive materials 250/270 may be formed as doped or undoped semiconductive materials. The first and second semiconductive materials 250/270 may be deposited as amorphous or crystalline semiconductive materials.

In one embodiment the second semiconductive material 270 may fill the trench 210 only up to a second thickness. After annealing the second semiconductive material the trench is filled with a third semiconductive material up to a third thickness and then annealed. The trench may be completely filled with several layers of semiconductive materials each of them deposited up to a certain thickness and then annealed. Such a process may form a second gate electrode having several grain boundary interfaces.

Figure 6B:
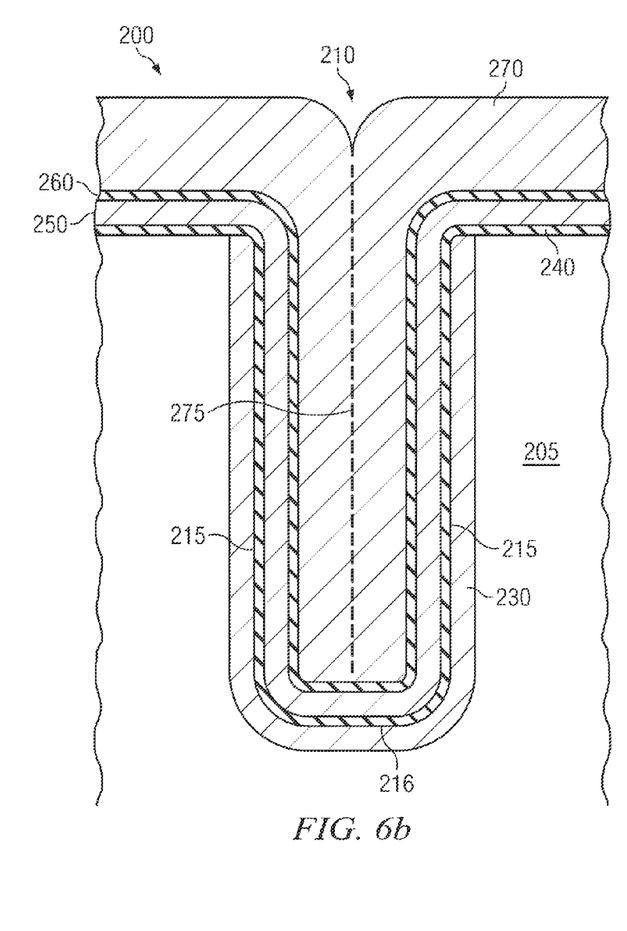
Figure 7B:
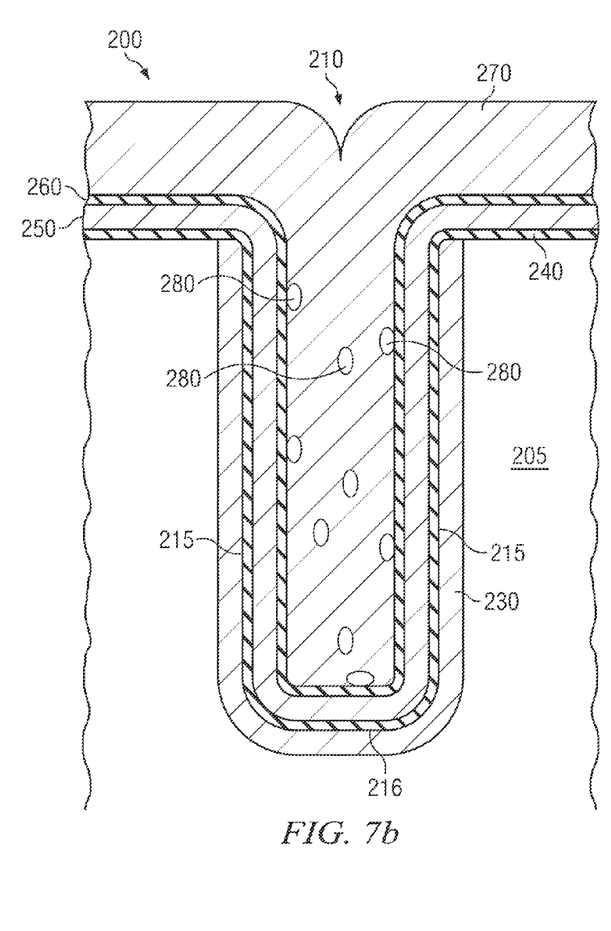
Figure 7C:
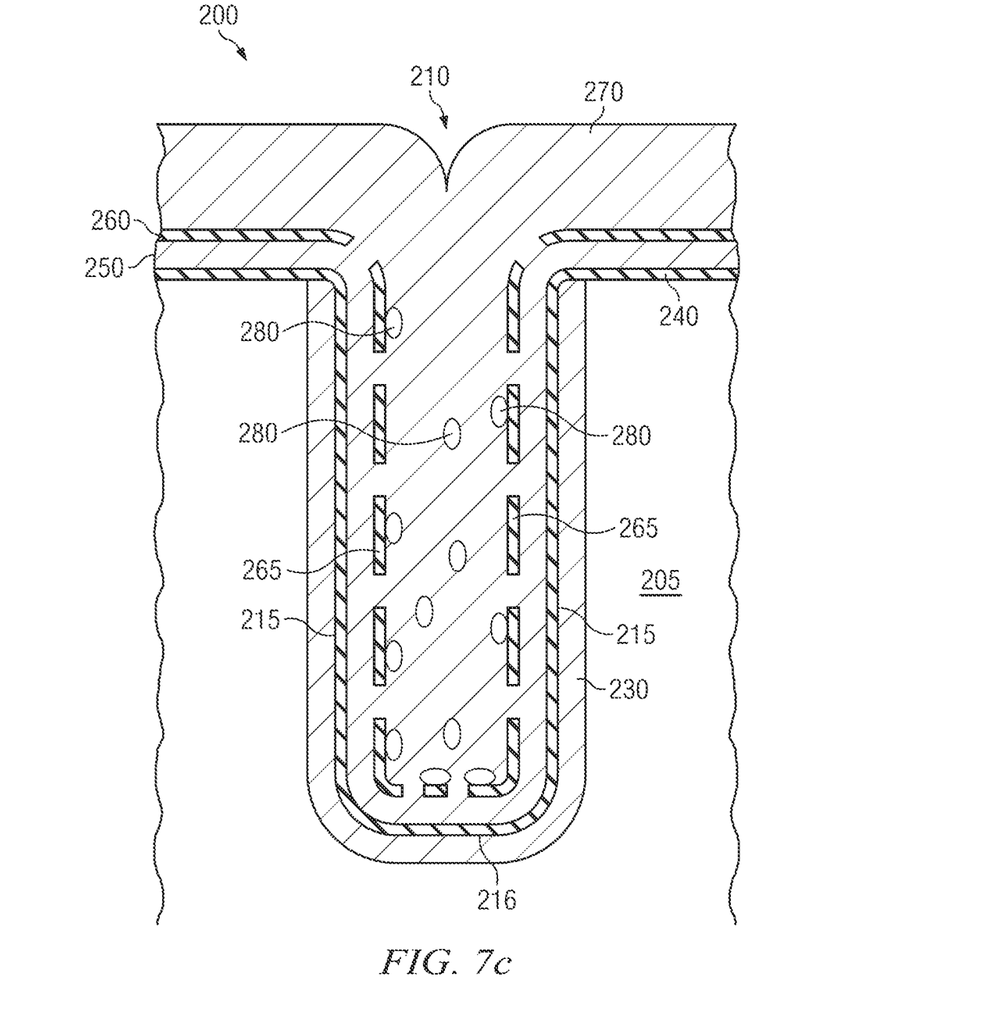

Referring now to FIGS. 6b and 7b-7c, after forming the first silicon material 250 a thin isolation layer is formed as interface 260. The thin isolation layer 260 may comprise an oxide or a nitride, for example. The thin isolation layer 260 may be less than about 3 nm thick, or alternatively, about 0.5 nm to about 3 nm thick.

The first and the second semiconductive materials 250/270 and the thin isolation layer 260 may be annealed to a temperature above the crystallization temperature, e.g. to a temperature of about 800 C or higher. Above the crystallization temperature the semiconductive materials may recrystallize. Additional voids 280 may be created through volume changes predominantly in the second semiconductive material 270. The voids 280 may move towards the sidewalls 215 and the bottom surface 216 of the trench 210 but may be stopped at the thin isolation layer 260. The voids 280 are unable to gather at the dielectric layer 240 close on the sidewalls 215 or the bottom surface 216 of the trench 210.

In one embodiment the thin isolation layer 260 is a nitride through which the first and second semiconductive materials can electrically connect.

In one embodiment the thin isolation layer 260 is an oxide forming islands 265 at a temperature of about 1000 C or higher. The two semiconductive materials 250/270 may recombine and may electrically connect in areas between the islands 265. The voids 280 remain at the interface 260 and may not move towards the sidewalls 215 and the bottom surface 216 of the trench 210 because the recrystallization of the semiconductive materials and/or the movement of the voids 280 was completed before the formation of the islands 265. The voids 280 may be pinned by the islands 265. This is shown in FIG. 7c.

In one embodiment the second semiconductive material may fill the trench only up to a second thickness. A second thin isolation layer is formed over the second semiconductive material. A third semiconductive material is formed up to a third thickness on the second thin isolation layer. A third thin isolation layer is formed over the third semiconductive material and so on. The trench may be filled with several semiconductive material layers and several thin isolation layers before the layer stack is annealed forming the second gate electrode. Such a process may form a laminated second gate electrode having several interfaces. In one embodiment all thin isolation layers are oxide layers, or all thin isolation layers are nitride layers. Alternatively the thin isolation layers are a combination of oxide and nitride layers. In some embodiments the laminated second gate electrode may comprise a grain boundary, a thin nitride layer, a thin oxide layer or combinations thereof.

Figure 8A:
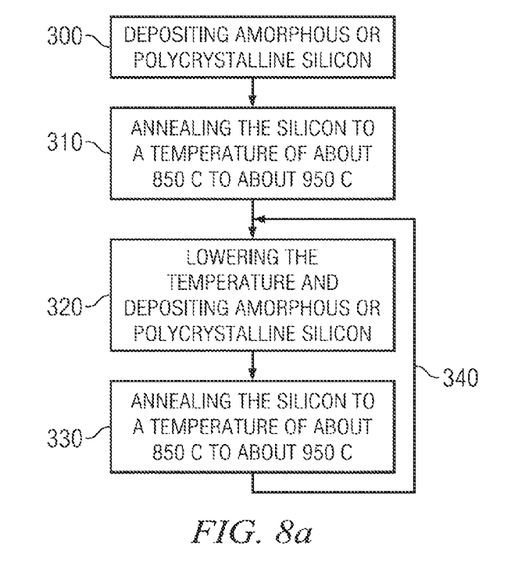
FIGS. 8a through 8c show flow charts of embodiments of the present invention.

FIG. 8a shows a flow chart of an embodiment of a deposition process for the second gate electrode 250/270 comprising a grain boundary interface 260.

The workpiece 200 may be put in a process chamber of a chemical vapor deposition (CVD) apparatus after the deposition or growth of the dielectric layer 240.

In a step 300 the trench 210 is filled to a first thickness with amorphous or polycrystalline silicon in a low pressure CVD (LPCVD) process. Alternatively, other deposition processes may be used such as atomic layer deposition (ALD), ALD-like processes or plasma enhanced CVD (PECVD), for example. The trench 210 may be exposed to one or more volatile precursors which may react and/or decompose in the trench to produce the desired deposit. Volatile by-products may also be produced which may be removed by gas flow through the reaction chamber.

Amorphous or polycrystalline silicon may be formed using silane ($SiH_4$). The reaction may be $SiH_4 \rightarrow Si + 2\, H_2$. Amorphous silicon may be deposited using temperatures below about 600 C, e.g., temperatures from about 500 C to about 560 C and pressures below 1000 mTorr. With a rapid thermal CVD (RTCVD) process amorphous silicon may be deposited up to about 650 C. Polycrystalline silicon may be deposited using temperatures above about 600 C, e.g., temperature from about 610 C and about 650 C and pressures below 1000 mTorr. RTCVD polycrystalline silicon process may run at temperatures above about 650 C.

In step 310 the disposed silicon is annealed to a temperature of above the crystallization temperature, e.g., 800 C or higher, leading to shrinkage of the silicon. This lowers the tendencies of additional void creation after the trench is completely filled.

In step 320 the temperature in the process chamber may be lowered below about 600 C, e.g., temperatures from about 500 C to about 560 C if amorphous silicon is deposited. The temperature may be lowered above about 600 C, e.g., temperatures from about 610 C to about 650 C if polycrystalline silicon is deposited. The second silicon deposition process may completely fill the trench 210 and may create voids along the center line 275.

In step 330 the silicon may again be annealed to a temperature above the crystallization temperature, e.g., a temperature of about 800 C or higher. The silicon recrystallizes and additional voids 280 may be formed. The voids 280 may move towards the sidewalls 215 and the bottom surface 216 of the trench but are trapped at the grain boundary interface 260. The voids may not move to the sidewalls 215 or the bottom surface 216 of the trench 210.

In an optional process step 340 the formation and the annealing of the silicon layer is repeatedly carried out forming a second electrode having a plurality of silicon layers and several grain boundary interfaces.

Figure 8B:
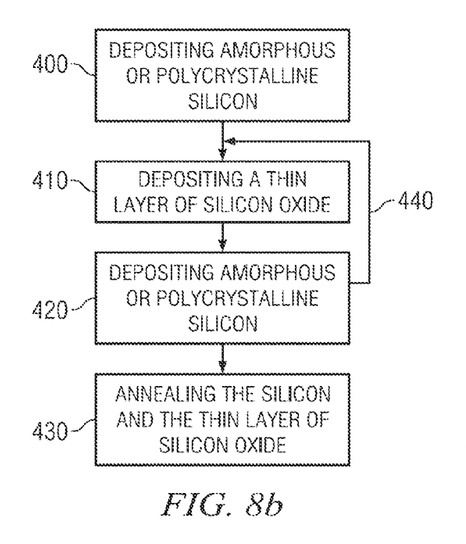

FIG. 8b shows a flow chart of an embodiment of a deposition process for a second gate electrode 250/270 comprising an oxide interface 260.

The workpiece 200 is put in a process chamber of a chemical vapor deposition (CVD) apparatus after the deposition of the dielectric layer 240.

In step 400 the trench 210 is filled up to a first thickness with amorphous or polycrystalline silicon in a low pressure CVD (LPCVD) process. Alternatively, other deposition processes may be used such as ALD or ALD-like processes, for example.

Amorphous or polycrystalline silicon may be formed using silane ($SiH_4$). The reaction may be $SiH_4 \rightarrow Si + 2\, H_2$. Amorphous silicon may be deposited using temperatures below about 600 C, e.g., temperatures from about 500 C to about 560 C and pressures below about 1000 mTorr. With an RTCVD process amorphous silicon may be deposited up to about 650 C. Polycrystalline silicon may be deposited using temperatures above about 600 C, e.g., temperatures from about 610 C to about 650 C and pressures below about 1000 mTorr. RTCVD polycrystalline silicon process may run at temperatures above about 650 C. The thicknesses of the first silicon material 250 may be controlled by turning off the source gas silane.

In step 410 a thin silicon oxide layer 260 is deposited on the surface of the first silicon layer 250. In one embodiment the thin silicon oxide layer 260 is formed using silane and oxygen. The reaction may be $SiH_4 + O_2 \rightarrow SiO_2 + 2\, H_2$. In one embodiment the thin silicon oxide layer 260 is formed by using dichlorosilane ($SiCl_2H_2$) and nitrous oxide ($N_2O$). The reaction may be $SiCl_2H_2 + 2 N_2O \rightarrow SiO_2 + 2 N_2 + 2\, HCl$. In one embodiment the thin oxide layer 260 is formed by flowing an oxygen precursor, e.g., $O_2$, $O_3$, $N_2O$, into the chamber at temperatures of about 500 C or higher.

The thin oxide layer 260 may be formed by turning on process gases without taking the workpiece 200 from the process chamber. After forming the thin oxide layer 260 with a desired thickness, the process gases may be turned off and the process chamber may be purged using an inert gas.

After the process chamber is purged a second amorphous or polycrystalline silicon is deposited over the thin oxide layer 260. The second silicon material 270 may be formed by turning on the source gas silane again until the trench 210 is completely filled with the second silicon material 270 (in-situ process). This is shown in step 420. In an alternative embodiment the deposition of the silicon and the thin oxide layer can be done in different reaction chambers (ex-situ process).

In step 430 the first and second silicon and the thin oxide layer are annealed to a temperature of about 800 C or higher. The first and second silicon materials 250/270 recrystallize and additional voids 280 may be created. The voids 280 are mainly created along the seem line 275 and move towards the sidewalls 215 and the bottom surface 216 of the trench 210 but are trapped at the thin oxide layer 260. Voids 280 may only move as long as the silicon recrystallizes. If the recrystallization process is completed, which typically happens at a anneal of about 800 C or higher for a view seconds, the voids 280 do not move anymore. At a temperature above about 900 C the thin oxide layer 260 may form islands so that the first and second silicon materials 250/270 can physically and electrically connect. The voids 280 will not move towards the sidewalls 215 or the bottom surface 216 even after the first and second silicon materials 250/270 connect because the recrystallization is already completed.

In one embodiment the deposition step 420 does fill the trench 210 with the second silicon material 270 only up to a second thickness. A second thin oxide layer may be deposited or grown over the second silicon material 270. A third silicon material may be formed over the second thin oxide layer and so on. This process can be repeated if desired as shown in step 440 to form a laminated second gate electrode.

Figure 8C:
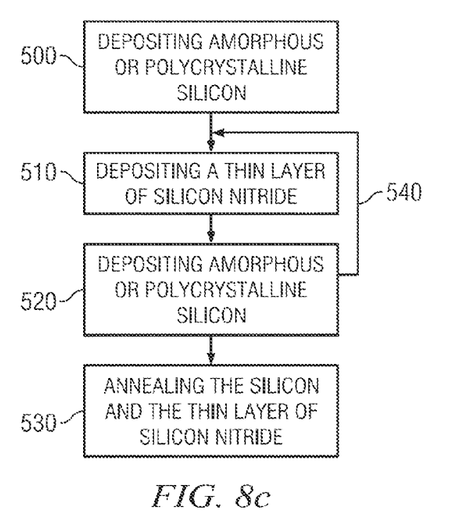

FIG. 8c shows a flow chart of an embodiment of a deposition process for a second gate electrode 250/270 comprising a nitride interface 260.

The workpiece 200 is put in a process chamber of a chemical vapor deposition (CVD) apparatus after the deposition of the dielectric layer 240.

In step 500 the trench 210 is filled up to a first thickness with amorphous or polycrystalline silicon 250 in a low pressure CVD (LPCVD) process. Alternatively, other deposition processes may be used such as ALD or ALD-like process, for example.

Amorphous or polycrystalline silicon may be formed using silane ($SiH_4$). The reaction may be $SiH_4 \rightarrow Si + 2 H_2$. Amorphous silicon may be deposited using temperatures below about 600 C, e.g., temperatures from about 500 C to about 560 C and pressures below about 1000 mTorr. With an RTCVD process amorphous silicon may be deposited up to about 650 C. Polycrystalline silicon may be deposited using temperatures above about 600 C, e.g., temperatures from about 610 C to about 650 C and pressures below about 1000 mTorr. RTCVD polycrystalline silicon process may run at temperatures above about 650 C. The thicknesses of the first silicon material 250 may be controlled by turning off the source gas silane.

In step 510 a thin silicon nitride layer is deposited on the surface of the first silicon layer 250. In one embodiment the thin silicon nitride layer 260 is formed using silane and ammonia ($NH_3$) as process gases. The reaction may be $3 SiH_4 + 4 NH_3 \rightarrow Si_3N_4 + 12 H_2$. Silicon nitride may also be deposited using dichlorosilane ($SiCl_2H_2$) and ammonia. The reaction may be $3 SiCl_2H_2 + 4 NH_3 \rightarrow Si_3N_4 + 6 HCL + 6H_2$.

The thin silicon nitride layer 260 may be formed by turning on process gases without taking the workpiece 200 from the process chamber. After forming the thin nitride layer 260 with a desired thickness, the process gases may be turned off and the process chamber may be purged using an inert gas. The thin silicon nitride layer 260 may be grown by flowing $NH_3$ at temperatures of about 700 C to about 1100 C into the process chamber at a low or an atmospheric pressure.

After the process chamber is purged a second amorphous or polycrystalline silicon 270 is deposited over the thin silicon nitride layer 260. The second silicon material 270 may be formed by turning on the source gas silane again until the trench 210 is completely filled with the second silicon material 270 (in-situ process). This is shown in step 520. In an alternative embodiment the deposition of the silicon and the thin silicon nitride layer can be done in different reaction chambers (ex-situ process).

In step 530 the first and second silicon materials 250/270 and the thin nitride layer 260 are annealed to a temperature above the crystallization temperature, e.g., a temperature of about 800 C or higher. The first and second silicon materials recrystallize and additional voids 280 may be created. The voids 280 are mainly created along the seem line 275 and move towards the sidewalls 215 and the bottom surface 216 of the trench 210 but are trapped at the thin nitride layer 260. The first and second silicon materials 250/270 may electrically connect through the thin nitride layer 260.

In one embodiment the deposition step 520 does fill the trench 210 with the second silicon material 270 only up to a second thickness. A second thin nitride layer may be deposited or grown over the second silicon material 270. A third silicon material may be formed over the second thin nitride layer and so on. This process can be repeated if desired as shown in step 540 to form a laminated second gate electrode.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor device, the method comprising:
   forming a trench in a substrate;
   forming a first semiconductive electrode supported by trench sidewalls;
   forming a dielectric layer on the first semiconductive electrode;
   forming a second semiconductive electrode on the dielectric layer, wherein forming the second semiconductive electrode comprises forming dielectric islands within the second semiconductive electrode; and
   forming a second dielectric layer within the first semiconductive electrode.

2. The method according to claim 1, wherein the dielectric islands comprise a thickness of less than 2 nm.

3. The method according to claim 1, wherein the dielectric islands comprises a first non-continuous layer of oxide islands.

4. The method device according to claim 1, wherein the second dielectric layer is a second non-continuous layer of oxide islands.

5. The method according to claim 1, wherein the first semiconductive electrode comprises polysilicon.

6. A method for manufacturing a semiconductor device, the method comprising:
   forming a trench disposed in a substrate;
   forming a first semiconductor electrode within the trench, the first semiconductor electrode adjoining sidewalls of the trench;
   forming a second dielectric layer within the first semiconductive electrode;
   depositing a first dielectric layer over the first semiconductor electrode;
   depositing a first semiconductor material over the first dielectric layer;
   forming an isolation layer over the first semiconductor material;
   depositing a second semiconductor material over the isolation layer; and
   annealing to form non-continuous regions in the isolation layer and to electrically connect the first semiconductor material with the second semiconductor material through opening between the non-continuous regions in the isolation layer.

7. The method according to claim 6, wherein the non-continuous regions are non-continuous but periodically arranged along a direction parallel to the sidewalls and bottom surface of the trench.

8. The method according to claim 6, wherein the non-continuous regions comprise a thickness of less than 2 nm.

9. The method according to claim 6, wherein the isolation layer comprises silicon nitride or silicon oxide.

10. A method for manufacturing a semiconductor device, the method comprising:
    forming a trench in a semiconductor substrate;
    forming a first semiconductive electrode adjoining sidewalls of the trench;
    forming a first dielectric layer on the first semiconductive electrode; and
    forming a second semiconductive electrode on the first dielectric layer, wherein the second semiconductive electrode comprises oxide or nitride islands within the second semiconductive electrode, wherein the oxide or nitride islands are arranged along a line parallel to the sidewalls of the trench; and
    forming a second dielectric layer within the first semiconductive electrode.

11. The method according to claim 10, wherein the oxide or nitride islands comprise a thickness of less than 2 nm.

12. The method according to claim 10, wherein the oxide or nitride islands are periodically distributed and separated by regions of the second semiconductive electrode.

13. The method according to claim 10, wherein the second dielectric layer is a non-continuous layer of oxide or nitride islands.

14. The method according to claim 10, wherein the first semiconductive electrode comprises polysilicon.

15. The method according to claim 10, wherein the second semiconductive electrode further comprises a plurality of voids.

16. A method for manufacturing a semiconductor device, the method comprising:
    forming a trench in a semiconductor substrate;
    forming a first semiconductive electrode adjoining sidewalls of the trench;
    forming a first dielectric layer on the first semiconductive electrode; and
    forming a second semiconductive electrode on the first dielectric layer, wherein the second semiconductive electrode comprises oxide or nitride islands within the second semiconductive electrode, wherein the oxide or nitride islands are arranged along a line parallel to the sidewalls of the trench, wherein the second dielectric layer is a non-continuous layer of oxide or nitride islands; and
    forming a second dielectric layer within the first semiconductive electrode.

17. The method according to claim 16, wherein the oxide or nitride islands comprise a thickness of less than 2 nm.

18. The method according to claim 16, wherein the oxide or nitride islands are periodically distributed and separated by regions of the second semiconductive electrode.

19. The method according to claim 16, wherein the first semiconductive electrode comprises polysilicon.

20. The method according to claim 16, wherein the second semiconductive electrode further comprises a plurality of voids.

* * * * *